(12) United States Patent
Liang

(10) Patent No.: US 7,214,088 B1
(45) Date of Patent: May 8, 2007

(54) REMOVABLE COMPUTER HOST HOUSING ASSEMBLY

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/353,100

(22) Filed: Feb. 14, 2006

(51) Int. Cl.
*H01R 13/64* (2006.01)

(52) U.S. Cl. ..................... 439/377; 361/686

(58) Field of Classification Search ............... 439/374, 439/377
See application file for complete search history.

(56) References Cited

U.S. PATENT DOCUMENTS

| | | | |
|---|---|---|---|
| 6,038,126 A * | 3/2000 | Weng ..................... 361/679 |
| 6,122,173 A * | 9/2000 | Felcman et al. ............ 361/726 |
| 6,181,552 B1 * | 1/2001 | Neville et al. .............. 361/686 |
| 6,421,243 B1 * | 7/2002 | Ives et al. .................. 361/725 |
| 6,661,671 B1 * | 12/2003 | Franke et al. ............... 361/752 |

* cited by examiner

*Primary Examiner*—Xuong Chung-Trans
(74) *Attorney, Agent, or Firm*—Lowe Hauptman & Berner, LLC (57) ABSTRACT

A removable computer host housing assembly includes a hollow and penetrated host housing having an interior thereof defined as a front accommodating chamber and a rear accommodating chamber; a rear housing having a plurality of rectangular accommodating cells therein and an upper long rectangular accommodating cell at and upper section thereof; wherein each rectangular accommodating cell is assembled with a power supply module, each upper long rectangular accommodating cell is assembled with one interface circuit module, and the rear housing is assembled into the rear accommodating chamber; and one server module appearing as a rectangular housing, and being vertically inserted into the rear accommodating chamber. A plurality of interface circuit modules, power supply modules, server modules can be speedily assembled with or disassembled from an interior of the host housing, thereby accomplishing maintenance or module expansion with speed and convenience.

6 Claims, 14 Drawing Sheets

REMOVABLE COMPUTER HOST HOUSING ASSEMBLY

BACKGROUND OF THE INVENTION (a) Field of the Invention

The invention relates to a removable computer host housing assembly, and more particularly, to an industrial host housing that can be quickly assembled to or disassembled from power supply modules, interface circuit modules, server modules or other expansion circuit card modules, thereby providing speedy and convenient maintenance as well as assembly process thereof.

(b) Description of the Prior Art

Host modules, server modules and power supply modules of prior industrial computer hosts are designed based on modules with specifications required by workload of computer device terminals. For instance, supposed a computer is capable of controlling tasks of five operating machines, when a provisional operating machine, a near-end or far-end monitor system, or an interface module such as a data card or a circuit card is required for expansion, an original host housing cannot be installed with the additional host, server, power supply or interface card modules in a timely fashion. Instead, a new host control module is necessarily purchased for satisfying the new equipment.

Moreover, various modules in a prior host housing mainly adopts fastening methods by screwing or buckling. Therefore, time is wasted when assembling or disassembling the various modules by going through unfavorable operations.

In view of the above shortcomings, it is a vital task of the invention as how to provide a host housing capable of speedily assembling with or disassembling from various power supply modules, server modules and interface circuit modules therein.

SUMMARY OF THE INVENTION

The primary object of the invention is to provide a removable computer host housing assembly, with which a plurality of interface circuit modules, power supply modules, server modules or other expansion circuit card modules can be speedily assembled to or disassembled from an interior of the host housing, thereby accomplishing maintenance or module expansion with speed and convenience.

The other object of the invention is to provide a removable computer host housing assembly, with which various modules are enabled to steadily secure to the host housing.

To better understand the invention, detailed descriptions are given with the accompanying drawings below.

DETAILED DESCRIPTION OF THE PREFERRED EMBODIMENTS

Figure 1:
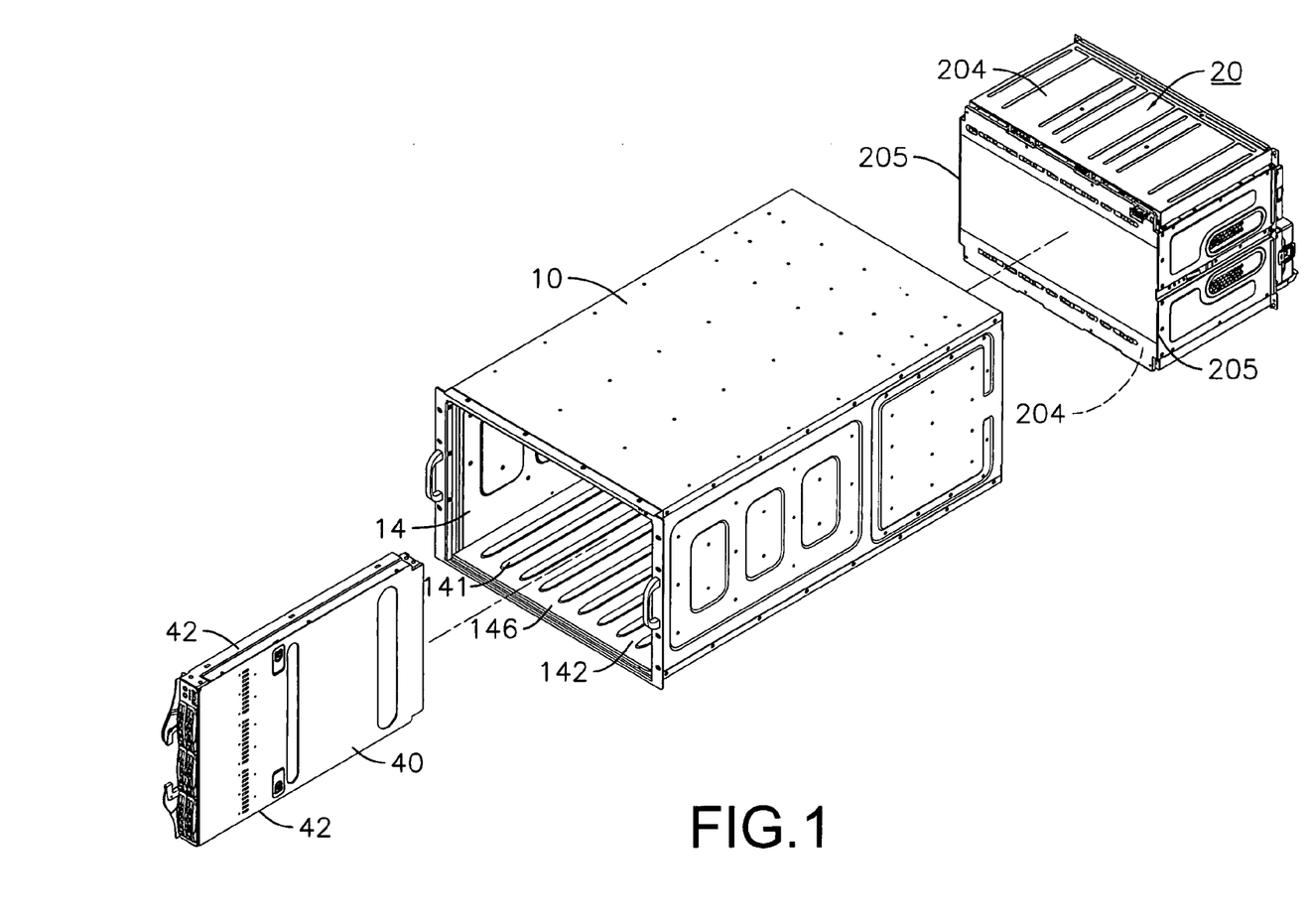
FIG. 1 shows an elevational view of an assembly of a host housing, a rear housing and a server module according to the invention.
Figure 2:
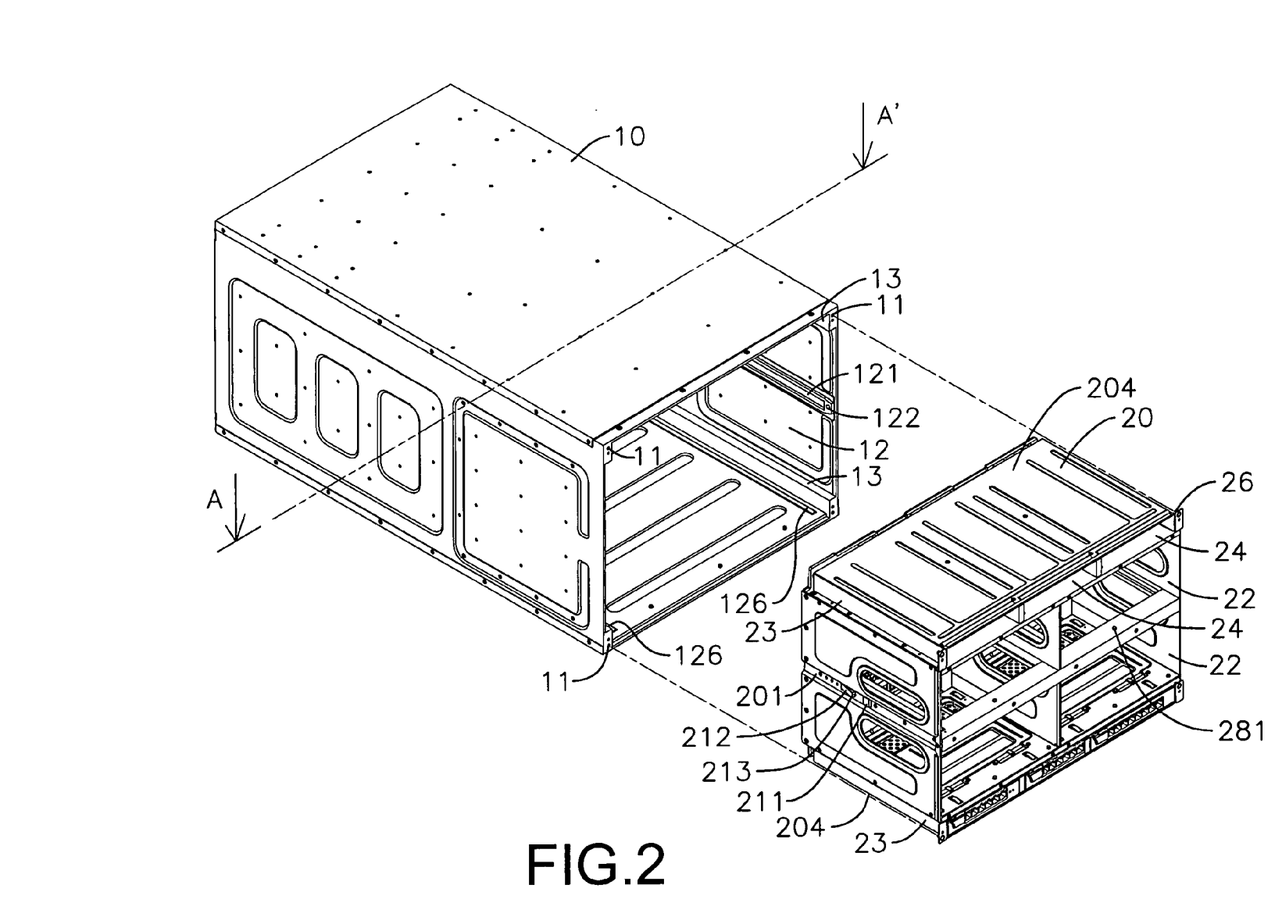
FIG. 2 shows an elevational view of an assembly of a host housing and a rear housing according to the invention.
Figure 3:
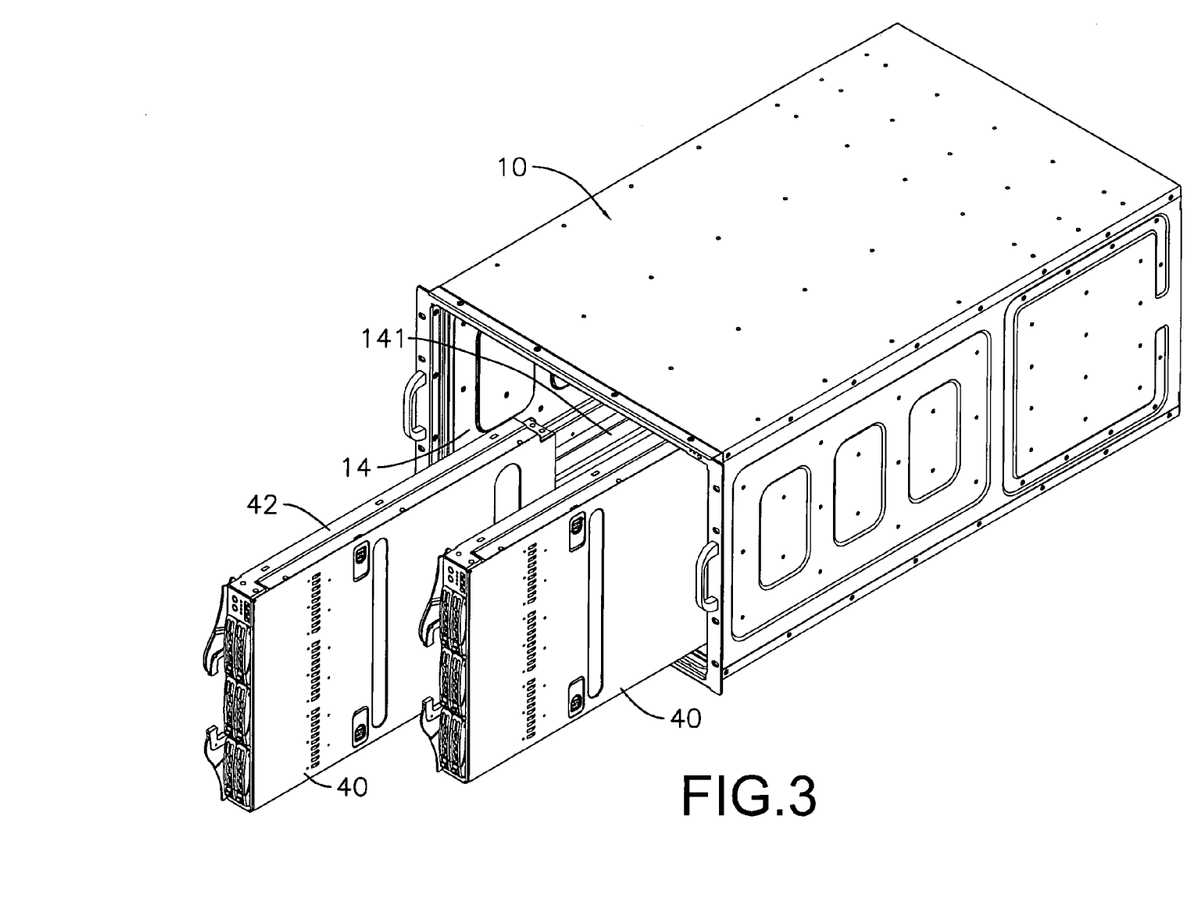
FIG. 3 shows an elevational view of an assembly of a host housing and a server module according to the invention.
Figure 5:
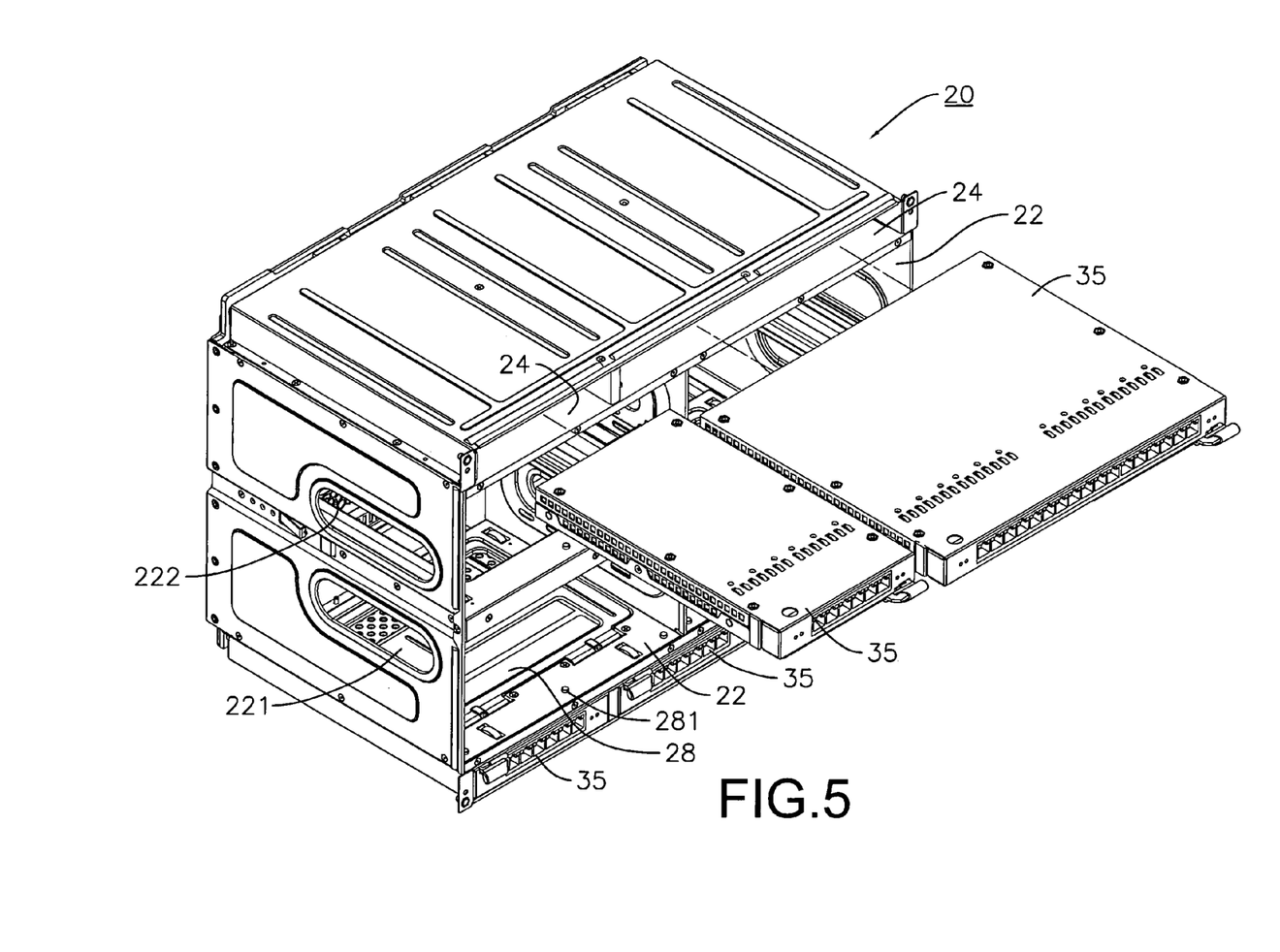
FIG. 5 shows an elevational view of an assembly of a rear housing and an interface circuit module according to the invention.
Figure 6:
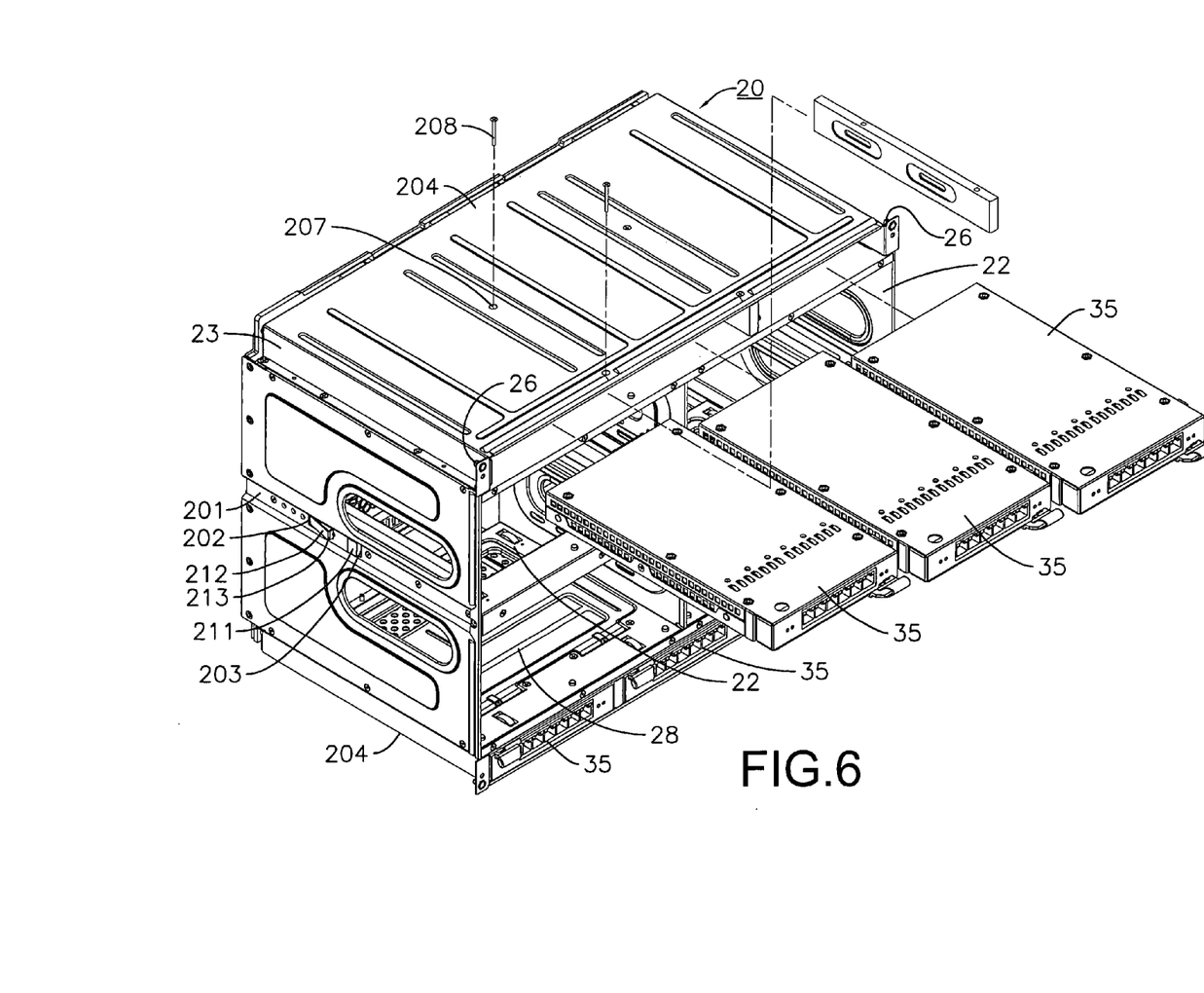
FIG. 6 shows an elevational view of an assembly of a rear housing and an interface circuit module in another embodiment according to the invention.
Figure 8:
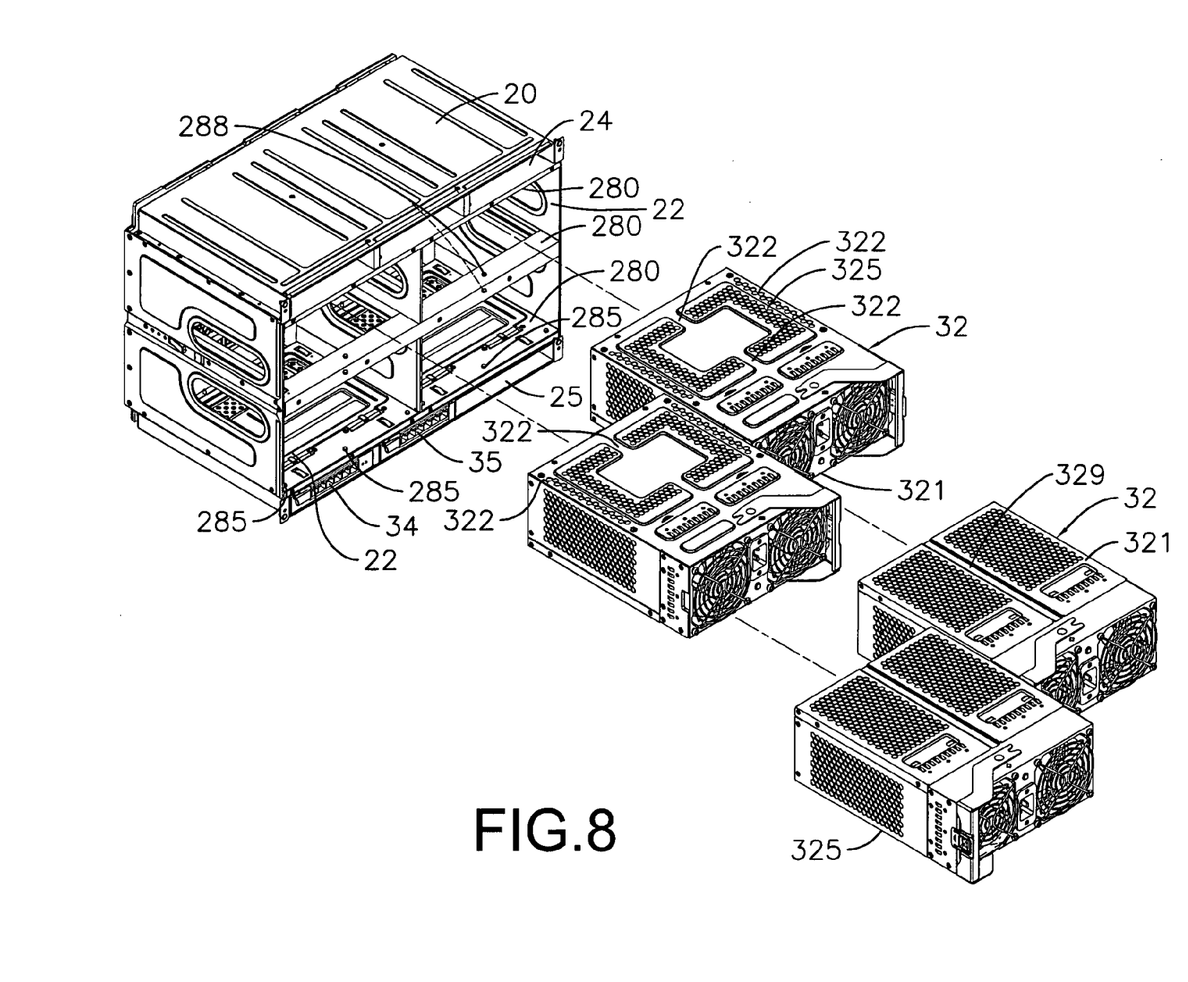
FIG. 8 shows an exploded elevational view illustrating a power supply module inserted and connected to a rear housing according to the invention.

Referring to FIG. 1, FIG. 2 and FIG. 3, a removable computer host housing assembly comprises:

a hollow and penetrated host housing 10 having an interior thereof defined as a front accommodating chamber 14 and a rear accommodating chamber 12, wherein the front and rear accommodating chambers 14 and 12 are in communication;

a rear housing 20 having a plurality of rectangular accommodating cells 22 therein and at least an upper long rectangular accommodating cell 24 at and upper section thereof, and can be assembled into the rear accommodating chamber 12 as shown in FIG. 2; wherein each rectangular accommodating cell 22 can be assembled with a power supply module 32 as shown in FIG. 8, and each upper long rectangular accommodating cell 24 can be assembled with at least one interface circuit module 35 as shown in FIG. 5 and FIG. 6; and at least one server module 40 appearing as a rectangular housing, and being vertically inserted and assembled into the rear accommodating chamber 12 as shown in FIG. 1 and FIG. 3.

Figure 10:
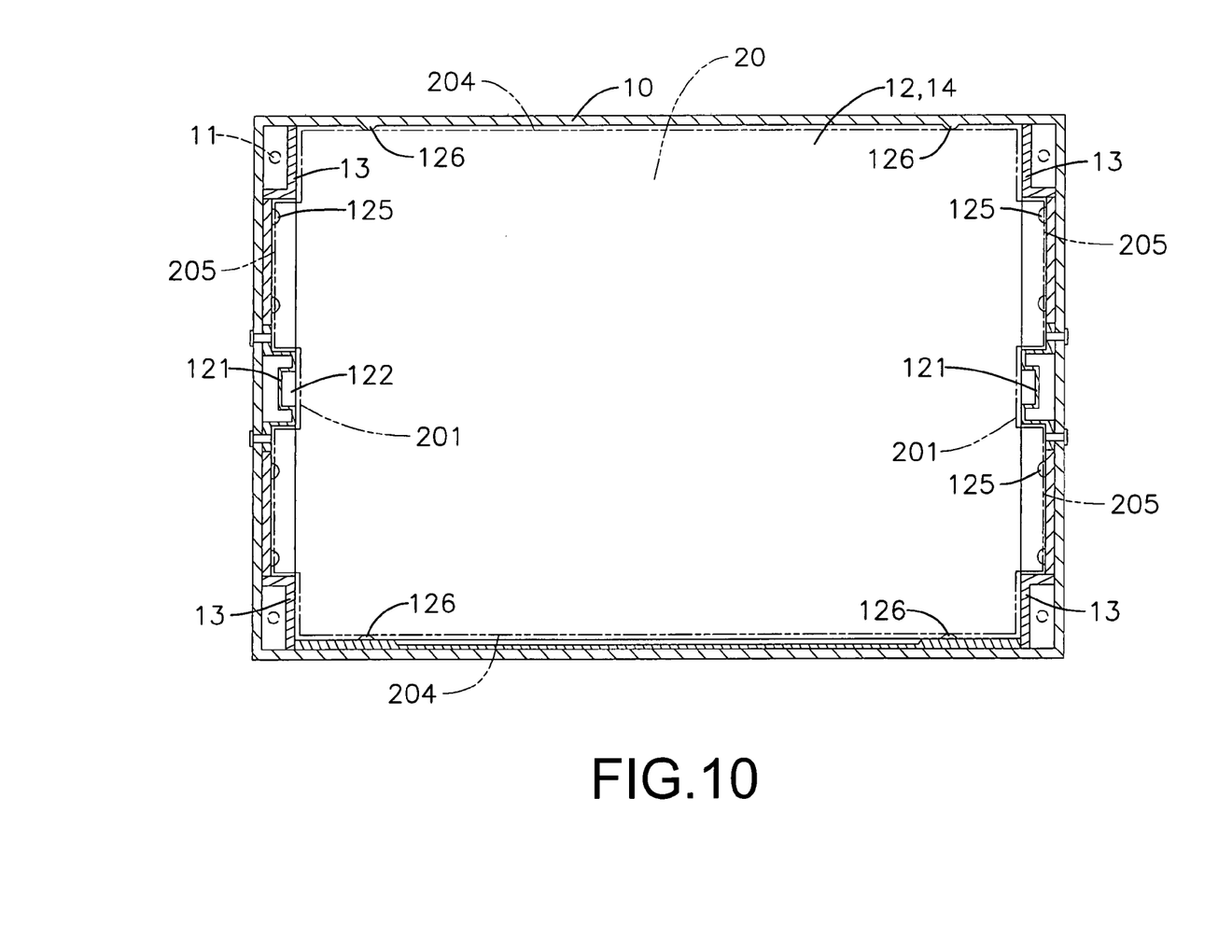
FIG. 10 shows a sectional view of FIG. 2 along a line A–A'.

Referring to FIG. 2 and FIG. 10, the rear accommodating chamber 12 has two side walls thereof respectively formed with long and sliding grooves 121. Each of the sliding grooves 121 has a front end thereof provided with a stopping section 122. The host housing 10 has four corners at a front end thereof formed with locating holes 11, from which protruding ribs 13 are extended toward a rear direction.

Figure 13:
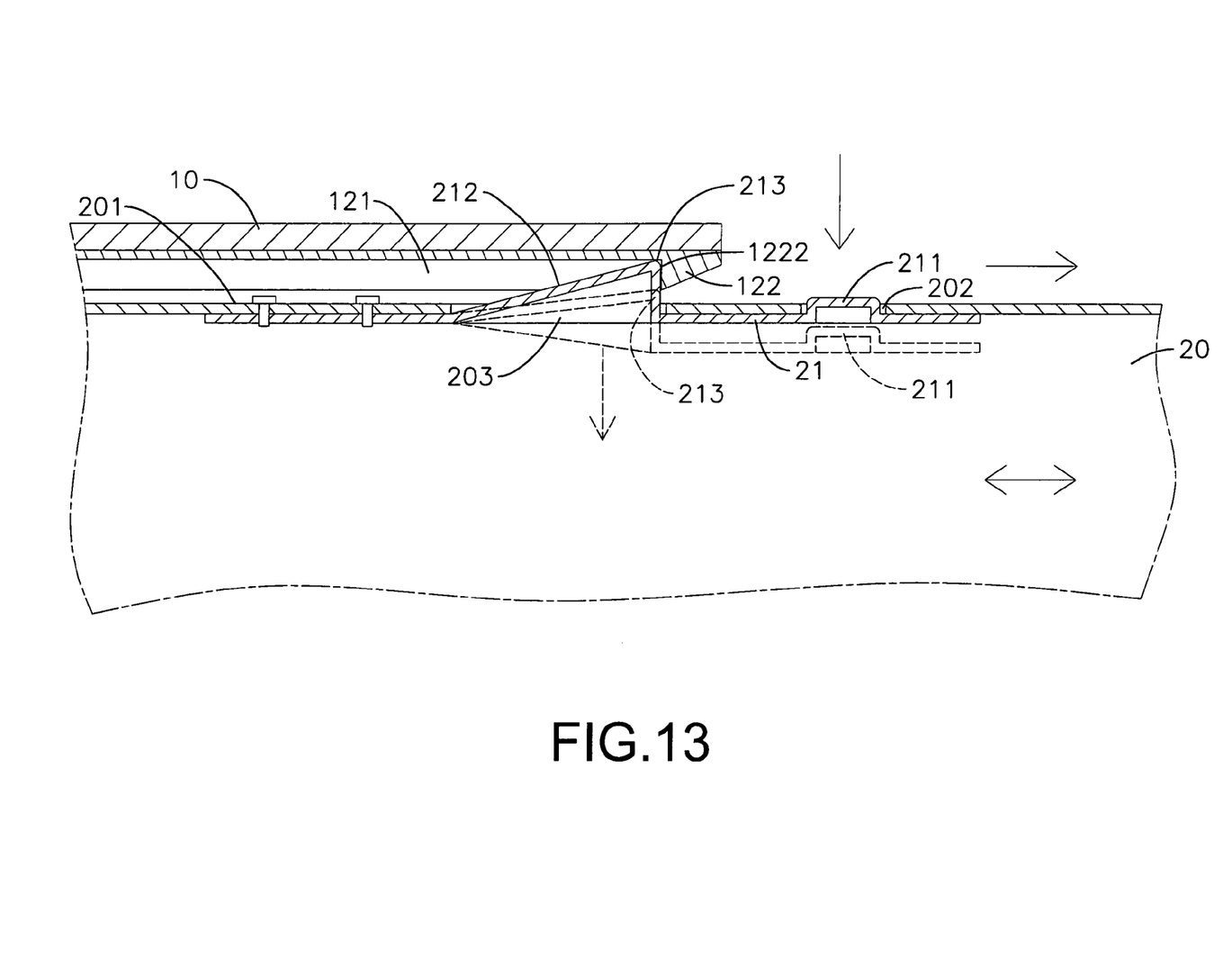
FIG. 13 shows a sectional schematic view illustrating motions of a spring plate being pressed and deformed according to the invention.

Referring to FIG. 6 and FIG. 13, the rear housing 20 has two side walls thereof respectively formed with grooves 201. A wall of each groove 201 is provided with a front opening 202 and a rear opening 203, and a long strip-like spring plate 21. The spring plate 21 has a projecting pressing section 211, a projecting inclined slope 212, and a slightly outstanding fastening section 213 on the inclined slope 212. As shown in FIG. 6, the rear housing 20 further has each of four corners thereof devised with a pin 26. An inwardly shrunken L-shaped indenture 23 is formed at the side of the pins 26. The fastening sections 212 are allowed to slide in the sliding grooves 121. The pins 26 are fastened into the locating holes 11, and the L-shaped indentures 23 are correspondingly fitted into the ribs 13 as shown in FIG. 2.

Figure 7:
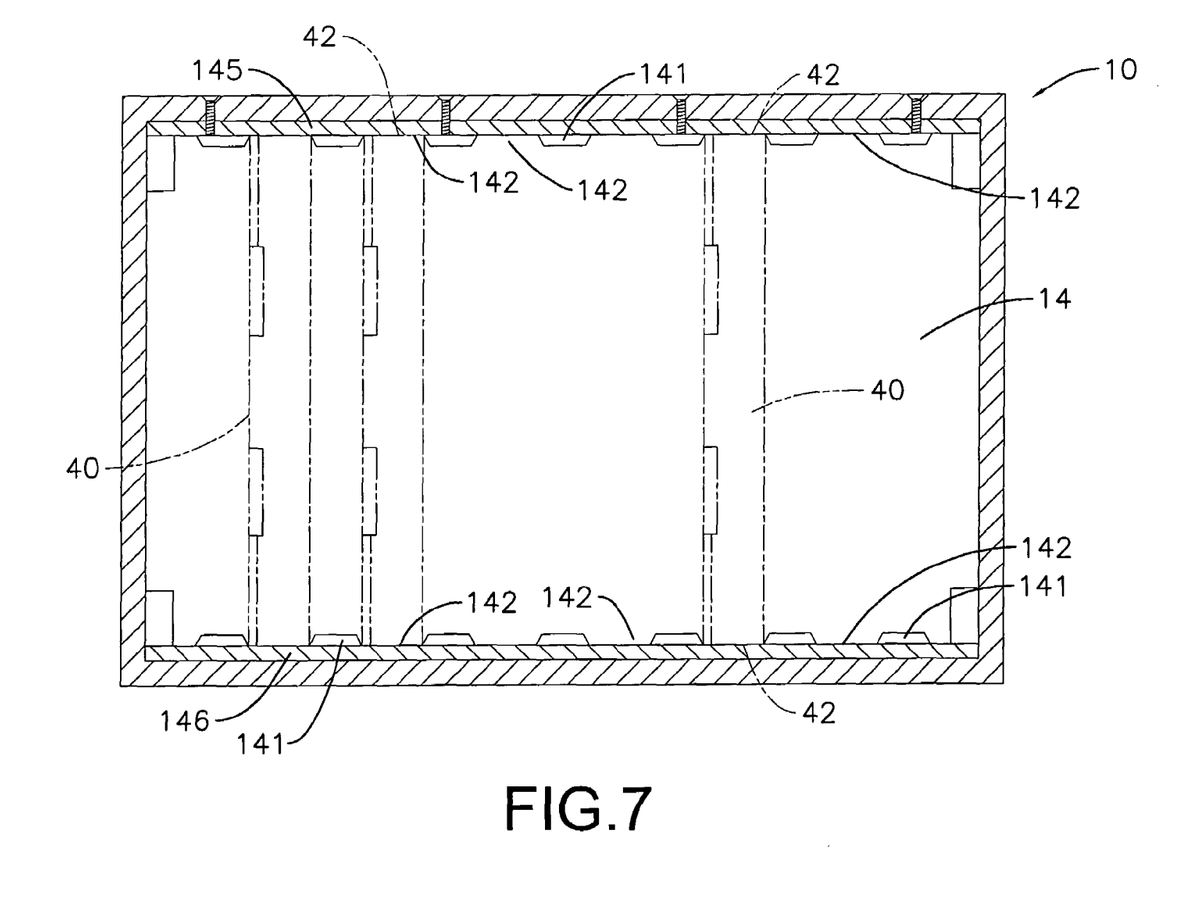
FIG. 7 shows a sectional schematic view illustrating a server module inserted and connected to a host housing according to the invention.

Referring to FIG. 1 and FIG. 7, the front accommodating chambers 14 has upper and lower wall surfaces thereof connected to upper and lower module plates 145 and 146 by means of screwing. The upper and lower module plates 145 and 146 are respectively provided with a plurality of long protruding sections 141 (141), and between adjacent long protruding sections 141 (141) are inserting slots 142.

At least one server module 40 has sliding planes 42 at upper and lower sections thereof slid and connected into the inserting slot 142.

Referring to FIG. 10, the rear accommodating chamber 12 has two side walls thereof provided with a plurality of blocking bulging sections 125. When the rear housing 20 is inserted into the rear accommodating chamber 12, the end sections of two side walls thereof are butted against the blocking bulging sections 125.

Figure 4:
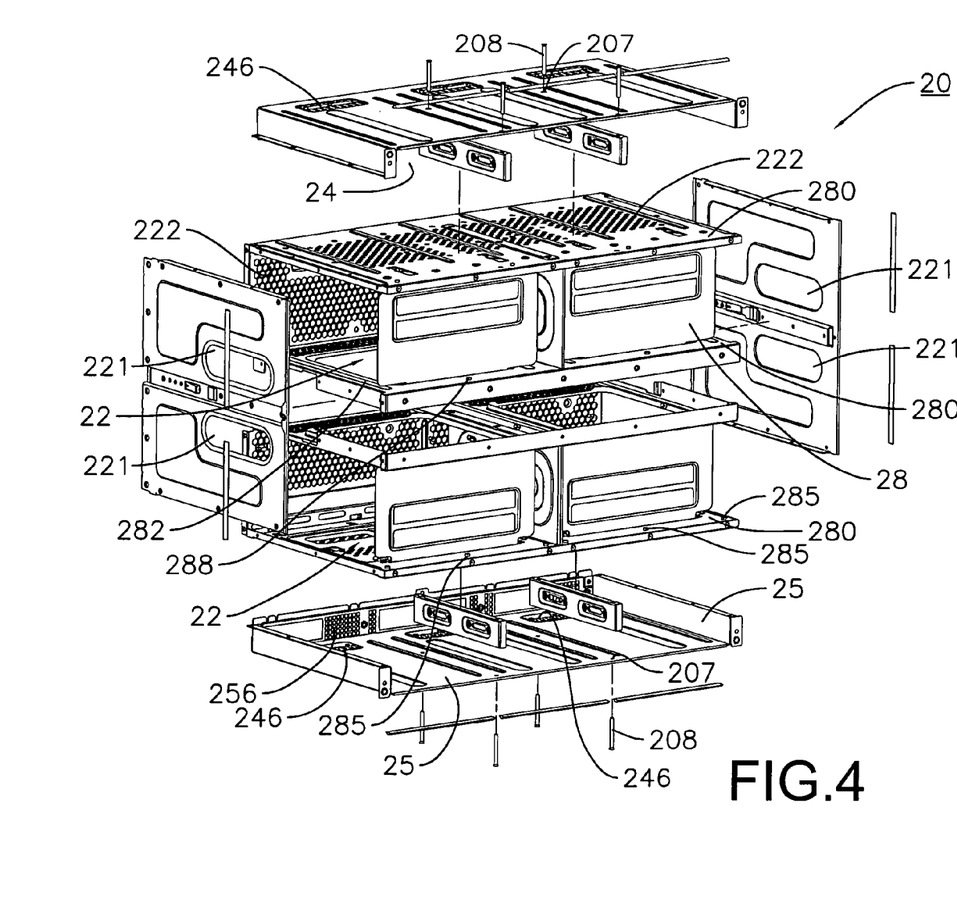
FIG. 4 shows an exploded elevational view of a rear housing according to the invention.

Referring to FIG. 4, FIG. 5, and FIG. 6, the rear housing 20 has a lower section thereof provided with at least one long rectangular accommodating cell 25 for accommodating and assembling with an interface circuit module 35.

Referring to FIGS. 2 and 10, the rear accommodating chamber 12 has an inner wall surface thereof provided with protruding linear sliding tracks 126. Upper and lower surfaces 204 of the rear housing 20 are allowed to slide on the linear sliding tracks 126.

Figure 9A:
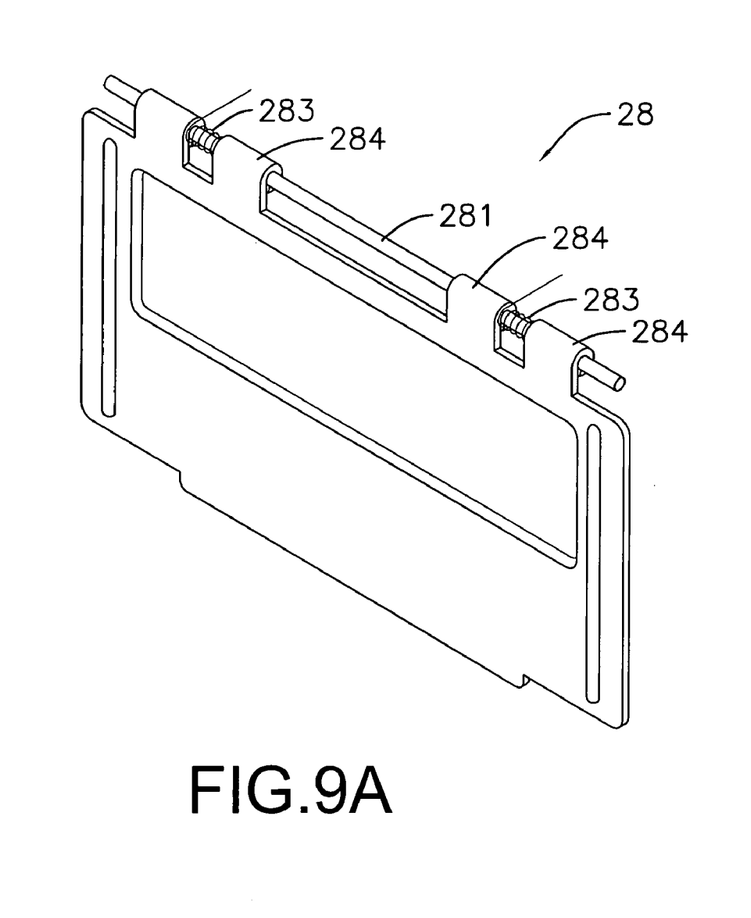
FIG. 9A shows an elevational view of an elastic gate according to the invention.
Figure 9B:
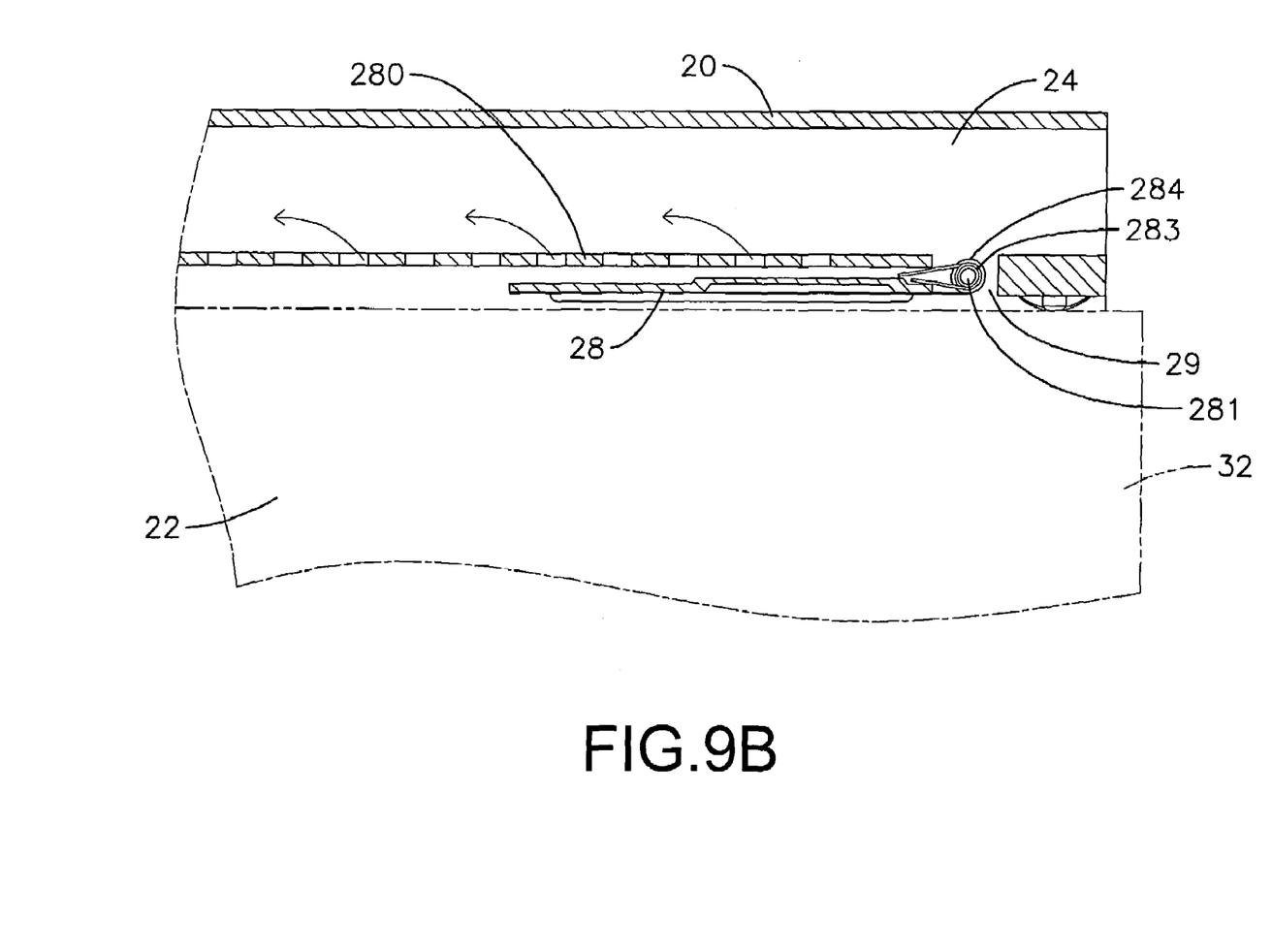
FIG. 9B shows a sectional view illustrating motions of an elastic gate according to the invention.

Referring to FIG. 9A and FIG. 9B, the rectangular accommodating cell 22 has a horizontal wall surface 280 thereof formed with a long hole 29. An elastic gate 28 has a connecting sleeve 284 thereof joined at the long hole 29 using an axial pin 281 and springs 283. Wherein, the springs 283 are put around the axial pin 281, and each has one end thereof pushed against an inner wall of the elastic gate 28 and the other end pushed against a wall of the horizontal wall surface 280.

Figure 12:
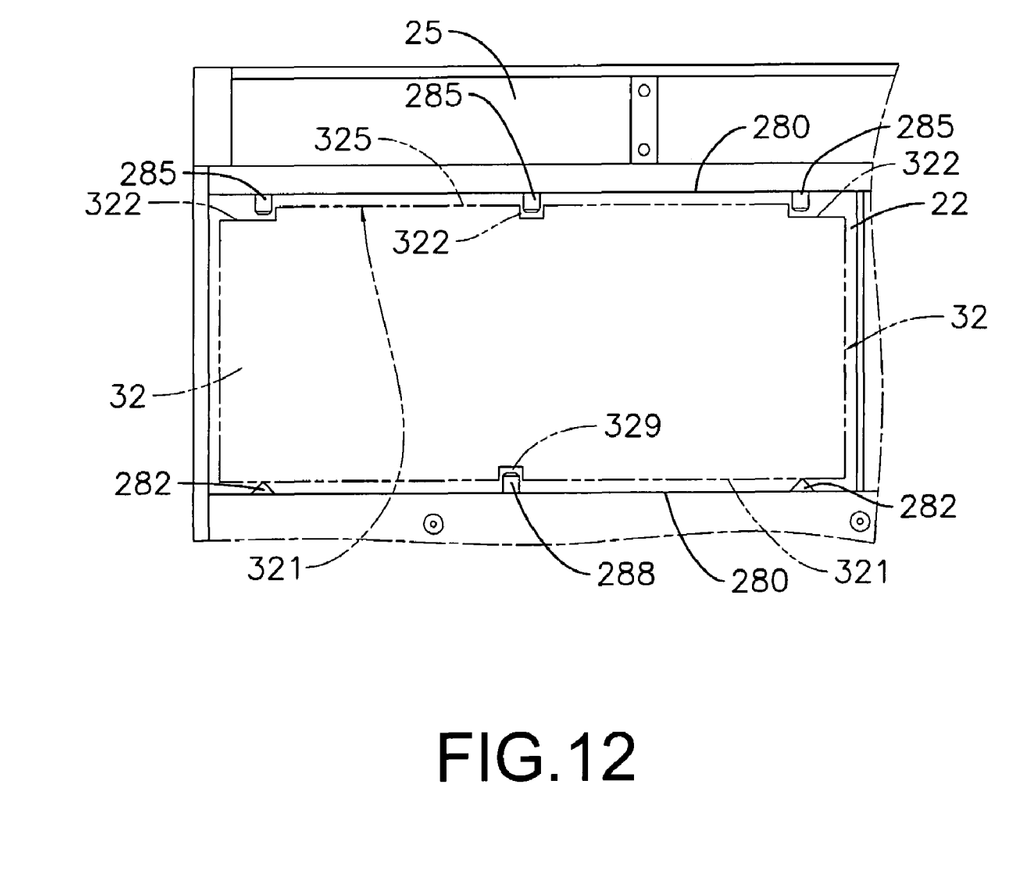
FIG. 12 shows a partial sectional schematic view illustrating a power supply module having been inserted and connected into a rear housing according to the invention.

Referring to FIG. 9B and FIG. 4, each rectangular accommodating cell 22 has four inner wall surfaces thereof formed with air openings 221 and net openings 222 for ventilation, and the horizontal wall surfaces 280 thereof provided with at least two guiding axial pins 285 and at least two longitudinal sliding tracks 282 in a projecting manner. Either a single upper sliding surface 325 or a single lower sliding surface 321 of the power supply module 32 is provided with at least two longitudinal guiding channels 322 as shown in FIG. 8. The guiding channels 322 has entrances thereof corresponding with the axial pins 284, and the lower sliding surface 321 perform sliding movements on the sliding tracks 282 as shown in FIG. 12, thereby sliding and connecting the power supply module 32 into the rectangular accommodating cell 22.

When the rear housing 20 is assembled to or disassembled from the host housing 10:

Referring to FIG. 2 showing an elevational view of the rear housing 20 assembled to or disassembled from the host housing 10, the rear housing 20 is slid and inserted into the rear accommodating chamber 12 from front of the rear accommodating chamber 12. The stopping sections 122 are located at front ends of the sliding grooves 121. Referring to FIG. 13, when the upper and lower surfaces 204 of the rear housing 20 perform sliding movements along the linear sliding tracks 126 (126) in the rear accommodating chamber 12, the fastening sections 213 protruding from the spring plates 21 are contracted and deformed from receiving pressure. Meanwhile, the pressing sections 211 located in the front openings 202 are drawn inward. To be more precise, the pressing sections 211 are indistinctly projecting out of the front openings 202. Thus, when the spring plates 21 are slid along the rear housing 20 toward an interior of the rear accommodating chamber 12, the pressing sections 211 do not come into contact with the stopping sections 122. However, when coming into contact with surfaces of the stopping sections 122 due to sliding movements, the fastening sections 213 are elastically contracted downward to allow the fastening sections 213 to pass through the stopping sections 122 to elastically move into the sliding grooves 121, thereby inserting and connecting the rear housing 20 into the rear accommodating chamber 12. Referring to FIG. 10, the upper and lower surfaces 204 (204) of the rear housing 20 perform sliding movements along the linear sliding tracks 126. For that the sliding tracks 126 are linear in structure, frictional forces produced between the sliding tracks 126 and the upper and lower surfaces 204 (204) are relatively reduced, such that the entire rear housing 20 is able to be smoothly inserted and connected into the rear accommodating chamber 12. Referring to FIG. 1, when inserted and located to a dead center, the rear housing 20 has two side wall ends 205 thereof pushed against the blocking bulging sections 125 shown in FIG. 10. The pins 26 at the four corners of the rear accommodating chamber 12 are inserted into the locating holes 11 at the four corners of the host housing 10 as shown in FIG. 2, and the L-shaped indentures 23 are flexibly and correspondingly connected to the ribs 13, thereby steadily securing the rear housing 20 into the rear accommodating chamber 12.

To draw the rear housing 20 out of the rear accommodating chamber 12, the upper and lower surfaces 204 (204) of the rear housing 20 are slid in a reverse direction along the sliding tracks 126 (126), and the pins 26 are disengaged from the locating holes 11. Referring to FIG. 13, a height of the pressing sections 211 approach lower surfaces of the grooves 201, and hence the pressing sections 211 easily pass through the stopping sections 122. At this point, a great effect is achieved. To be more exactly, when the entire rear housing 20 is drawn half-way, the fastening sections 213 are pushed against inner walls 1222 of the stopping sections 122 at front ends of the sliding grooves 121 by being more outstanding to further provide braking effects, thereby preventing the rear housing 20 from falling out of the host housing 10 when drawn by excessive forces.

After braking, the pressing sections 211 are pressed by fingers of a user to be moved downward. The spring plates 21 are elastically moved and deformed to compel the fastening sections 213 to move downward into the rear openings 20, thereby dismissing braking effects by liberating the fastening sections 213 downward from the stopping sections 122. The user may simultaneously apply outward forces again to draw the rear housing 20 out of the rear accommodating chamber 12. Thus, when the rear housing 20 is drawn out of the host housing 10, two-stage drawing motions are provided for a user to draw the heavy rear housing 20 out of the host housing without having to worry about the rear housing 20 being fallen to the ground.

When the server module 40 is assembled to or disassembled from the host housing 10:

Referring to FIG. 1, FIG. 3 and FIG. 7 showing schematics illustrating motions of the server module 40 being inserted and connected into the host housing 10, the server module 40 is a rectangular housing having a width thereof slightly smaller than or equal to that of the inserting slots 142, so as to be smoothly inserted and located into the inserting slots 142. Wherein, the upper and lower module plates 145 and 146 are replaceable. In other words, inserting slots 142 of the upper and lower module plates 145 and 146 may have widths thereof adjusted according to widths of server modules 40 having different specifications. Therefore, inserting slots 142 having different widths can be selected by merely replacing the upper and lower module plates 145 and 146. Referring to FIG. 7, the upper and lower module plates 145 and 146 are positioned in the front accommodating chamber 14 by means of screwing, meaning that upper and lower module plates 145 and 146 having different specifications can be replaced in the front accommodating chamber 14. That is, for a server module 40 having a larger or smaller width, the upper and lower module plates 145 and 146 are replaced in order to provide inserting slots 142 having different widths in different quantities. Thus, using detachable and replaceable upper and lower module plates 145 and 146, server modules 140 having various specifications may be inserted and connected.

When the upper and lower long rectangular accommodating cells are selected and inserted by the interface circuit module 35:

Referring to FIG. 4, FIG. 5 and FIG. 6, the upper and lower long rectangular accommodating cells 24 and 25 may be provided with one, two or three accommodating cells based on actual requirements, and are targeted at adapting to quantity and dimensions of the interface circuit module 35.

Figure 11:
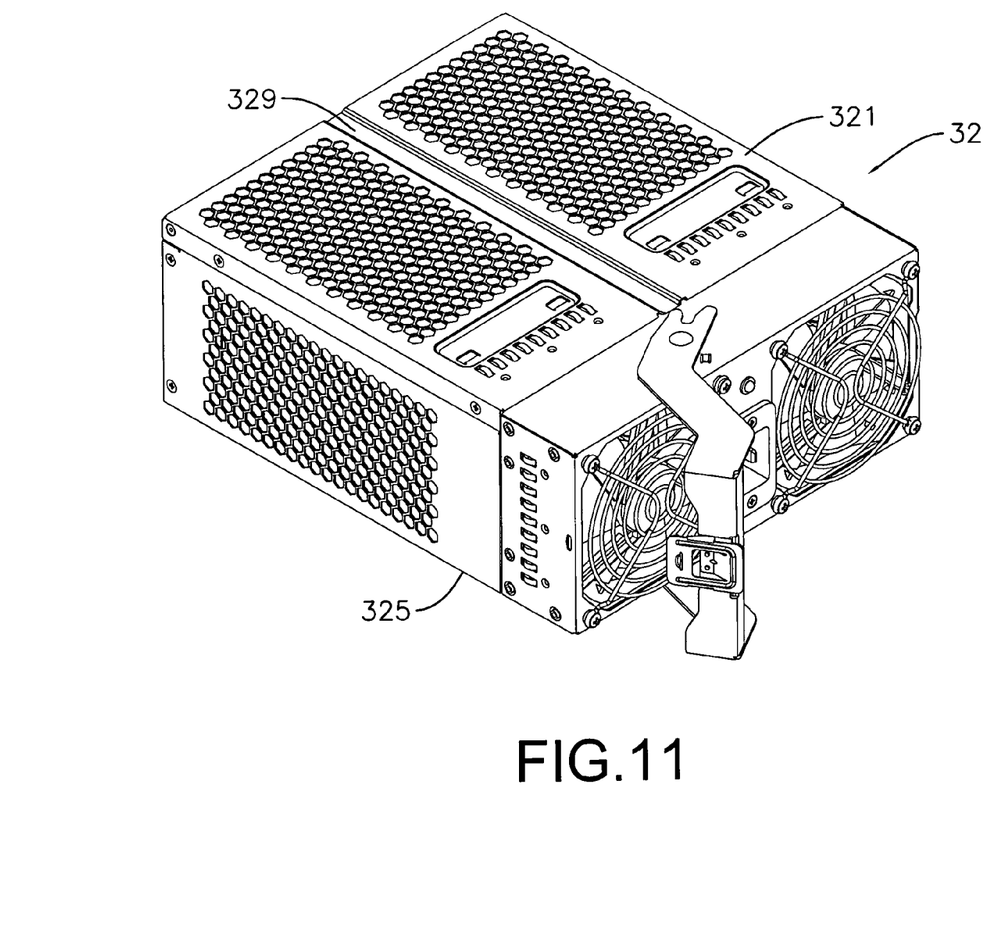
FIG. 11 shows an elevational view of a power supply module according to the invention.

When the power supply device module 32 is assembled to or disassembled from the rear housing 20:

Referring to FIG. 8 and FIG. 11, the power supply device is a square-like housing having upper and lower sliding surfaces 325 and 321. Only one plane from one of the upper sliding surface 325 or the lower sliding surface 321 is provided with three longitudinal guiding channels 322. Only one of the upper horizontal wall surface 280 or the lower horizontal wall surface 280 of the rectangular accommodating cell 22 is provided with three guiding axial pins 285 in appropriate distances, while the other horizontal wall surface 280 is provided with one axial pin 288. Therefore, the three guiding channels 322 are necessarily aligned and corresponded with the three axial pins 281 as shown in FIG. 12 when inserting the power supply module 32 into the rectangular accommodating cell 22. Referring to FIG. 11, supposed a user inserts the power supply module 32 in a reverse direction, the lower sliding surface 321 is not devised with three guiding channels 322 but only one guiding channel 329, whereas the horizontal wall surface 280 to be connected is provided with three guiding axial pins 285, and therefore directions of the three guiding channels 322 are not matched with those of the corresponding guiding axial pins 285. As a result, the power supply module 32 cannot be inserted into the rectangular accommodating cell 22 although forces are applied. At this point, the user becomes aware that the direction of the power supply module 32 being inserted is inappropriate, and further corrects the direction to successfully complete inserting and connecting the power supply module 32 by correspondingly sliding the three guiding channels 322 on the sliding surface 325 to the three guiding axial pins 285. Referring to FIG. 12, the linear sliding tracks 282 are provided on the horizontal wall surface 280 at a lower section of the rectangular accommodating cell 22, so as to minimizing frictional forces for offering smooth sliding movements of the lower sliding plane 321 on the sliding tracks 282. In FIG. 4, FIG. 5, FIG. 6 and FIG. 8, the horizontal wall surface 280 is defined as an upper inner wall surface or a lower inner wall surface of the rectangular accommodating cell 22. In other words, the three guiding axial pins 285 can be selectively provided at the upper horizontal inner wall surface or the lower horizontal inner wall surface.

The structure according to the invention is provided with ventilation effects.

Referring to FIG. 4, the rear housing 20 is provided with air openings 221 and net openings 222, and the upper and lower long rectangular accommodating cells 24 and 25 have walls thereof provided with net openings 246. Therefore, between the entire rear housing 20, the power supply module 32 and the server module 40 is a route for ventilation and dissipation.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A removable computer host housing assembly comprising:

a hollow and penetrated host housing having an interior thereof defined as a front accommodating chamber and a rear accommodating chamber, wherein the front and rear accommodating chambers are in communication;

a rear housing having a plurality of rectangular accommodating cells therein and at least an upper long rectangular accommodating cell at and upper section thereof, and is assembled into the rear accommodating chamber; wherein each rectangular accommodating cell is assembled with a power supply module, and each upper long rectangular accommodating cell is assembled with at least one interface circuit module;

at least one server module appearing as a rectangular housing, and being vertically inserted into and assembled with the front accommodating chamber;

wherein, the rear accommodating chamber has two side walls thereof respectively formed with long and sliding grooves; each of the sliding grooves has a front end thereof provided with a stopping section; and the host housing has four corners at a front end thereof formed with locating holes, from which protruding ribs are extended toward a rear direction;

the rear housing has two side walls thereof respectively formed with grooves; a wall of each groove is provided with a front opening and a rear opening, and a long strip-like spring plate; the spring plate has a projecting pressing section, a projecting inclined slope, and a slightly outstanding fastening section on the inclined slope; the rear housing further has each of four corners thereof devised with a pin; an inwardly shrunken L-shaped indenture is formed at the side of the pins; the fastening sections are allowed to slide in the sliding grooves; the pins are fastened into the locating holes; and the L-shaped indentures are correspondingly fitted into the ribs;

the front accommodating chamber has upper and lower wall surfaces thereof connected to upper and lower module plates by means of screwing; the upper and lower module plates are respectively provided with a plurality of long protruding sections; and between adjacent long protruding sections are inserting slots; and at least one server module has sliding planes at upper and lower sections thereof for sliding and connecting into the inserting slot.

2. The removable computer host housing assembly in accordance with claim 1, wherein the rear housing has a lower section thereof provided with at least one long rectangular accommodating cell for accommodating and assembling with an interface circuit module.

3. The removable computer host housing assembly in accordance with claim 1, wherein the rear accommodating chamber has two side walls thereof provided with a plurality of blocking bulging sections; when the rear housing is inserted into the rear accommodating chamber, the end sections of two side walls thereof are butted against the blocking bulging sections.

4. The removable computer host housing assembly in accordance with claim 1, wherein the rear accommodating chamber has an inner wall surface thereof provided with protruding linear sliding tracks; and upper and lower surfaces of the rear housing are allowed to slide on the linear sliding tracks.

5. The removable computer host housing assembly in accordance with claim 1, wherein rectangular accommodating cell has a horizontal wall surface thereof formed with a long hole; an elastic gate has a connecting sleeve thereof joined at the long hole using an axial pin and springs; the springs are put around the axial pin, and each has one end thereof pushed against an inner wall of the elastic gate and the other end pushed against a wall of the horizontal wall surface.

6. The removable computer host housing assembly in accordance with claim 1, each rectangular accommodating cell has four inner wall surfaces thereof formed with air openings and net openings for ventilation, and the horizontal wall surfaces thereof provided with at least two guiding axial pins and at least two longitudinal sliding tracks in a projecting manner; either a single upper sliding surface or a single lower sliding surface of the power supply module is provided with at least two longitudinal guiding channels; the guiding channels have entrances thereof corresponding with the axial pins; and the lower sliding surface perform sliding movements on the sliding tracks, thereby appropriately sliding and connecting the power supply module into the rectangular accommodating cell.

* * * * *